United States Patent [19]
Wada et al.

[11] Patent Number: 4,698,122
[45] Date of Patent: Oct. 6, 1987

[54] METHOD OF DIFFUSION OF IMPURITIES

[75] Inventors: Masaru Wada; Yoji Kato, both of Kanagawa, Japan

[73] Assignee: Sony Corporation, Tokyo, Japan

[21] Appl. No.: 802,475

[22] Filed: Nov. 27, 1985

[30] Foreign Application Priority Data

Nov. 27, 1984 [JP] Japan ................................ 59-248795

[51] Int. Cl.⁴ ......................... B44C 1/22; C03C 25/06
[52] U.S. Cl. .................................... 156/625; 156/628; 156/632; 156/633; 156/643; 156/653; 204/192.23; 204/192.37
[58] Field of Search ............... 156/625, 629, 633, 638, 156/643, 648, 644, 653, 628, 632; 204/192.23, 192.37

[56] References Cited
U.S. PATENT DOCUMENTS

| | | | |
|---|---|---|---|
| 4,264,381 | 4/1981 | Thompson et al. | 156/643 X |
| 4,380,489 | 4/1983 | Beinvogl et al. | 156/643 |
| 4,532,004 | 7/1985 | Akiyama et al. | 156/653 |
| 4,533,429 | 8/1985 | Josquin | 156/643 |

Primary Examiner—Robert L. Lindsay
Attorney, Agent, or Firm—Hill, Van Santen, Steadman & Simpson

[57] ABSTRACT

A method for selectively diffusing impurities such as zinc into the substrate of a compound semiconductor such as gallium arsenide (GaAs). The method makes use of a diffusion mask in such a manner that the thickness of the oxygen-containing layer at the interface between the diffusion mask and the semiconductor substrate is less than 20Å so that the abnormal transverse diffusion that would otherwise occur at the interface in the vicinity of the opening of the diffusion mask on the semiconductor surface is suppressed. The result is an increased accuracy in the diffusion pattern of the impurities.

10 Claims, 4 Drawing Figures

METHOD OF DIFFUSION OF IMPURITIES

BACKGROUND OF THE INVENTION

1. Field of the Invention

This invention relates to a method for selectively diffusing impurities such as zinc into the substrate of a compound semiconductor such as gallium arsenide (GaAs) to provide well defined implantation areas.

2. Description of the Prior Art

Recently, semiconductors making use of compound semiconductors such as gallium arsenide (GaAs) have been put into practical use. In the manufacture of such devices, it becomes necessary to effect selective diffusion of impurities into the substrate.

In a typical example from the prior art, an $SiO_2$ insulating film was deposited by chemical vapor deposition (CVD) on the GaAs substrate, and a diffusion window was formed in the film as by means of photoetching. By using the $SiO_2$ insulating film as the selective diffusion mask, impurities such as zinc were diffused into the substrate for forming the required diffusion zones. However, the impurities tended to be transversely diffused over a substantial distance at the interface between the $SiO_2$ film in the vicinity of the diffusion window and the GaAs substrate, creating an abnormal diffusion which made it difficult to control the size of the extent of the diffusion area. By "abnormal transverse diffusion" it is meant that the ratio of the transverse diffusion distance in the vicinity of the mask-substrate interface is large with respect to the vertical diffusion depth. If the transverse diffusion distance is denoted by the symbol x and the vertical diffusion depth by y, the ratio $\alpha$ is expressed as:

$$\alpha = \frac{\text{transverse diffusion distance } x}{\text{vertical diffusion depth } y}$$

In the case of the prior art, the ratio $\alpha$ is larger than unity and in the case of an $SiO_2$ film, the value of $\alpha$ is frequently equal to more than 4.

It has been generally recognized that the abnormal transverse diffusion exists not only when an $SiO_2$ film is used as the selective diffusion mask but also when a phosphosilicate glass (PSG) film is used as a mask or a silicon nitride film is deposited on the substrate. It has not heretofore been possible to effect selective diffusion of impurities with the required degree of accuracy desired in the diffusion pattern.

To summarize, when impurities such as zinc are selectively diffused on the substrate of a compound semiconductor such as GaAs, the above described abnormal transverse diffusion inevitably occurs, so that the accuracy of the diffusion pattern is decreased.

SUMMARY OF THE INVENTION

The present invention provides a method for diffusing impurities whereby the abnormal transfer diffusion is suppressed, and selective diffusion of the impurities is achieved with a high pattern accuracy while using compound semiconductors as the substrate materials.

As a result of our research for accomplishing the above objective, the present inventors have found that a transmutation layer is formed at the interface between the compound semiconductors and the diffusion mask because of oxygen contained in the selective diffusion mask, and that the primary cause of the above described transverse abnormal diffusion resides in the presence of such oxygen-containing transmutation layer. This finding was the basis of the present invention.

The present invention consists of a method of selectively diffusing impurities into the surface of a compound semiconductor, wherein the diffusion is achieved by employing a diffusion mask in which the thickness of the oxygen-containing layer at the interface between the mask and the substrate is controlled to a value of less than 20 Å.

When the thickness of the oxygen-containing layer at the mask-substrate interface is adjusted to be less than 20 Å, the abnormal transverse diffusion is prevented, so that impurities can be selectively diffused with a high degree of accuracy in the diffusion pattern in the substrate.

BRIEF DESCRIPTION OF THE DRAWINGS

Other objects and features of the present invention will become apparent from the following detailed description when read in conjunction with the accompanying sheets of drawings in which.

DESCRIPTION OF THE PREFERRED EMBODIMENTS

Figure 1:
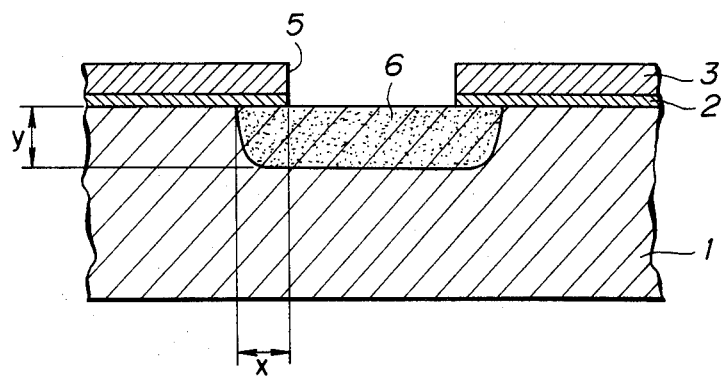
FIG. 1 is a cross-sectional view showing a preferred embodiment of the present invention.

Referring to the drawings, a preferred embodiment of the method of diffusing impurities according to the present invention will be described in detail.

The following description is made in conjunction with the diffusion of elemental zinc into a GaAs substrate but it should be noted that the present invention is also applicable to the selective diffusion of a variety of other impurities into substrates consisting of various compound semiconductors of the Group III-V or II-VI elements.

Referring to FIG. 1, there is shown a pretreated Gas substrate 1 on which there is deposited a silicon nitride SiN layer 2 and an $SiO_2$ layer 3 in that order. The conditions are controlled such that the thickness of the oxygen-containing layer at the substrate between the SiN layer 2 and the GaAs substrate 1 is less than 20 Å.

The pretreatment of the substrate can be carried out by subjecting the substrate 1 to washing in acetone, trichloroethylene, acetone and alcohol, each for 5 minutes, with the application of supersonic waves, followed by washing with water and etching in a potassium hydroxide solution. Upon prolonged contact with the ambient air, an oxide film is spontaneously formed on the thus treated GaAs substrate 1. In order to reduce the formation of the oxide film to a minimum, the $SiO_2$ film 3 is preferably deposited by a plasma assisted chemical vapor deposition (PACVD) method. For details of such method and a description of its operation, reference is invited to the "Metals Handbook" Ninth Edition, Volume 5 (1982), pages 381-386.

Figure 2:
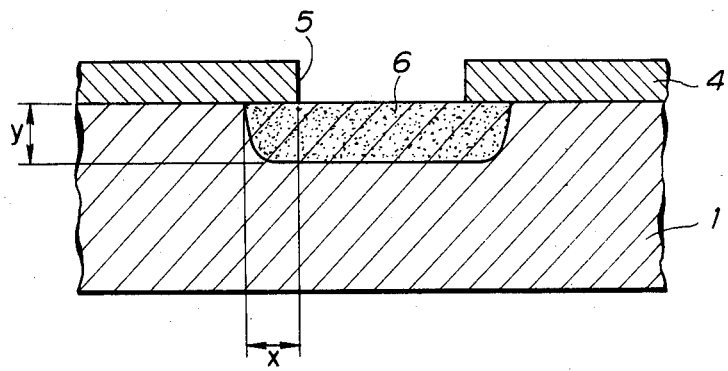
FIG. 2 is a cross-sectional view similar to FIG. 1 and showing a modified form of the present invention.

The $SiO_2$ layer 3 is optionally formed on the SiN layer 2. When the $SiO_2$ layer 3 is used as a selective diffusion mask, the thickness of the SiN layer 2 may be on the order of tens of angstroms, for example, 50 Å, while that of the $SiO_2$ layer 3 may be on the order of hundreds or thousands of angstroms, for example 1000 Å. When only an SiN layer 4 is used to the exclusion of the $SiO_2$ layer, as illustrated in FIG. 2, the film thickness of the SiN layer 4 may be on the order of hundreds or thousands of angstroms, for example, 2000 Å.

A diffusion window 5 is then formed, for example, using a conventional photolithographic technique. An impurity such as zinc is then diffused into the surface of the GaAs substrate by using the $SiO_2$ layer 3 and the SiN layer 2 or only the SiN layer 4 as a mask for the formation of a diffusion area 6.

Figure 3:
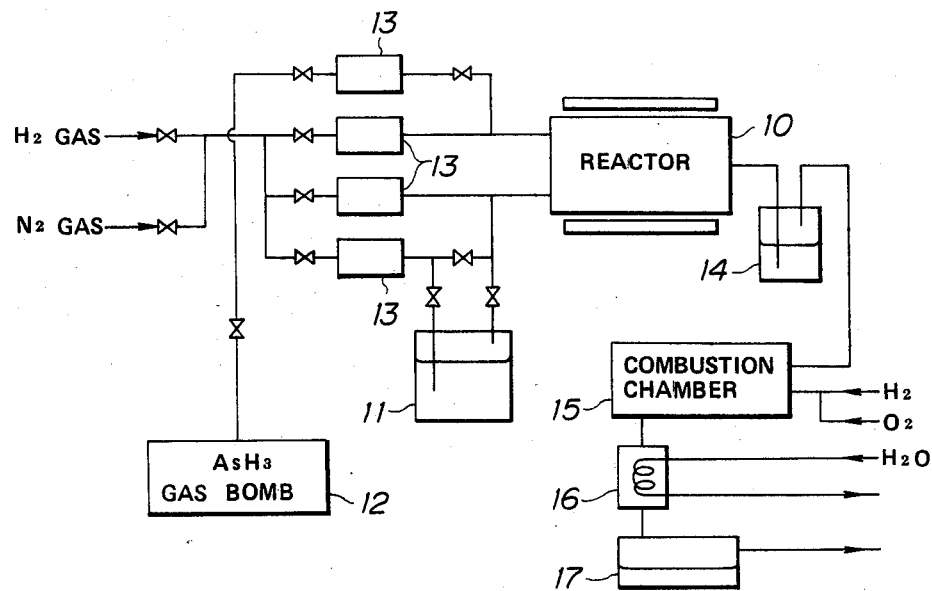
FIG. 3 is a block diagram illustrating the type of apparatus which can be used for diffusing impurities in accordance with the present invention.

FIG. 3 shows an example of the diffusion apparatus used for performing the diffusion operation. In this arrangement, elemental zinc is used as the diffused impurity, and an organometal compound such as diethyl zinc is used as the zinc source. The diethyl zinc is contained in a constant temperature tank 11 maintained at a temperature of about 2° C. Into the tank 11 there is introduced a hydrogen gas controlled by a flow control unit 13 to effect bubbling for conveying for diethyl zinc into a tube reactor 10. Arsine ($AsH_3$) gas from a gas bomb 12 is mixed with the hydrogen gas and the resulting hydrogen base gas containing about 2% arsine is conveyed to the tube reactor 10. The flow rate of the diethyl zinc and the arsine are controlled by the flow control unit 13 so the flow is typically about 30 cc per minute. The linear speed along the substrate surface of the tube reactor is then equal to approximately 14 cm per second. The diffusion temperature in the tube reactor 10 is adjusted so as to be about 600° C. Under these operating conditions, the density in the vicinity of the substrate surface is 2 to 3 $\times 10^{19}$ cm$^{-3}$ while the diffusion coefficient is 7 $\times 10^{-14}$ cm$^2$ per second. The discharge gases from the tube reactor are discharged through an oil trap 14, a combustion chamber 15 fed by means of hydrogen and oxygen lines, and a cooler 16 through which a water coolant passes. The discharge gasses is liquefied by cooling and stored in the tank 17.

When an impurity such as zinc is diffused in this manner into the GaAs substrate 1, the above described abnormal diffusion is substantially prevented. That is, the ratio $\alpha$ of the horizontal or transverse diffusion distance x in the vicinity of the substrate of the diffusion area 6 to the vertical diffusion depth y is on the order of 0.5 to 1 so that selective diffusion of impurities is achieved with the required degree of accuracy in the size of the diffusion pattern.

Figure 4:
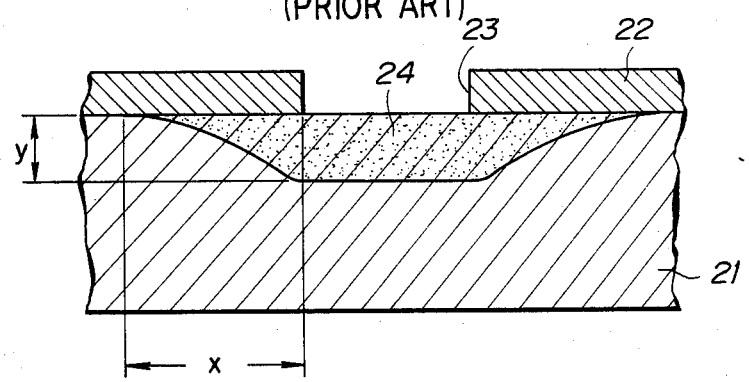
FIG. 4 is a view similar to FIGS. 1 and 2, but showing the prior art method of diffusing impurities into the substrate.

This should be contrasted with the showing of FIG. 4 which depicts a situation which existed in the prior art. In that Figure, there is shown an $SiO_2$ insulating film 22 which has been deposited as by means of chemical vapor deposition on a GaAs substrate 21, with a diffusion window 23 being formed therein by means of photoetching. By using the $SiO_2$ insulating film 22 as a selective diffusion mask, impurities such as zinc are diffused into the GaAs substrate 21 for forming a diffusion area 24. However, the impurities are transversely diffused over a relatively long distance at the interface between the $SiO_2$ film 22 in the vicinity of the diffusion window 23 and the GaAs substrate 21, this abnormal diffusion making it difficult to control the size or extent of the diffusion area 24. Under these circumstances, the ratio $\alpha$ previously defined is considerably larger than unity.

It should be noted that the film quality and purity of the SiN layer and above all the oxygen content are related to the refractive index. For preventing abnormal diffusion, it is necessary that the refractive index of the SiN be in the range from 2.0±0.07, the thickness of the oxygen-containing layer then being less than 20 Å. The refractive index is preferably in the range of 2.0±0.05 and more preferably in the range of 2.0±0.03.

As an example of a method for producing the SiN layer having a low oxygen content, the GaAs substrate before deposition of the SiN layer may be subjected to annealing, for example, at 850° C. for 15 minutes while being subjected simultaneously to a plasma discharge in a hydrogen gas atmosphere, for reducing the oxide film present on the GaAs substrate and decreasing the film thickness. The SiN layer is then applied by the plasma assisted chemical vapor deposition method on the so treated surface to provide an extremely thin oxygen-containing layer at the interface between the GaAs substrate and the SiN layer.

It will be seen from the above description that the method of diffusing impurities in accordance with the present invention makes it possible to effect selective diffusion of the impurities into the substrate of the compound semiconductor without giving rise to abnormal diffusion, and thus provides selective diffusion of the impurities with a high degree of pattern size accuracy.

Since many widely different embodiments of the present invention may be made without departing from the spirit and scope of the present invention, it is to be understood that the invention is not limited to the specific embodiments thereof except as defined in the appended claims.

We claim as our invention:

1. A method of selectively diffusing an impurity into the surface of a compound semiconductor which comprises:

applying a diffusion mask directly onto the compound semiconductor substrate while limiting the oxygen-containing layer at the interface between said mask and said substrate to less than 20 Å, and diffusing said impurity through said mask and into said substrate.

2. A method according to claim 1 wherein said compound semiconductor is gallium arsenide (GaAs).

3. A method according to claim 1 wherein said impurity is elemental zinc.

4. A method according to claim 1 which includes the step of etching the surface of the compound semiconductor with a potassium hydroxide solution prior to applying said diffusion mask thereover.

5. A method according to claim 1 wherein at least that portion of the diffusion mask which contacts the semiconductor substrate is composed of a layer of silicon nitride.

6. A method according to claim 5 in which:

the step of applying said diffusion mask is carried out by the plasma assisted chemical vapor deposition method.

7. A method according to claim 6 which includes the steps of subjecting the semiconductor substrate to annealing before the formation of said silicon nitride layer, and carrying out the plasma assisted chemical vapor deposition in a hydrogen gas atmosphere.

8. A method according to claim 5 wherein said layer of silicon nitride has a refractive index of 2.0±0.07.

9. A method according to claim 5 wherein said layer of silicon nitride has a refractive index of 2.0±0.05.

10. A method according to claim 5 wherein said layer of silicon nitride has a refractive index of 2.0±0.03.

* * * * *